US012596948B2

(12) United States Patent
Le Royer et al.

(10) Patent No.: US 12,596,948 B2
(45) Date of Patent: Apr. 7, 2026

(54) METHOD FOR MAKING A QUANTUM DEVICE

(71) Applicant: COMMISSARIAT A L'ENERGIE ATOMIQUE ET AUX ENERGIES ALTERNATIVES, Paris (FR)

(72) Inventors: Cyrille Le Royer, Grenoble (FR); François Lefloch, Grenoble (FR); Fabrice Nemouchi, Grenoble (FR); Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 463 days.

(21) Appl. No.: 18/057,435

(22) Filed: Nov. 21, 2022

(65) Prior Publication Data

US 2023/0186136 A1 Jun. 15, 2023

(30) Foreign Application Priority Data

Nov. 22, 2021 (FR) ..................................... 21 12297

(51) Int. Cl.
 *G06N 10/40* (2022.01)
 *H10N 60/12* (2023.01)
(52) U.S. Cl.
 CPC ............. *G06N 10/40* (2022.01); *H10N 60/12* (2023.02)
(58) Field of Classification Search
 CPC .... G06N 10/40; H10N 60/12; H10N 60/0661; H10N 60/0688; H10N 60/0912; H10N 60/01
 See application file for complete search history.

(56) References Cited

U.S. PATENT DOCUMENTS

| | | | | |
|---|---|---|---|---|
| 11,107,968 B1 * | 8/2021 | Holmes | ................. | H10N 60/12 |
| 2021/0143311 A1 * | 5/2021 | Holmes | ................. | H10N 69/00 |
| 2021/0151575 A1 * | 5/2021 | Holmes | ............... | H10D 64/205 |
| 2021/0296557 A1 * | 9/2021 | Holmes | ................. | H10N 60/12 |
| 2022/0094341 A1 * | 3/2022 | Pellerano | .............. | H10N 69/00 |
| 2022/0181536 A1 * | 6/2022 | Gordon | ............. | H10N 60/0156 |

OTHER PUBLICATIONS

French Preliminary Search Report Issued Jul. 27, 2022, in French Application 21 12297 filed on Nov. 22, 2021 (with English Translation of Categories of Cited Documents & written opinion), 7 pages.

(Continued)

*Primary Examiner* — Moazzam Hossain

(74) *Attorney, Agent, or Firm* — Oblon, McClelland, Maier & Neustadt, L.L.P.

(57) ABSTRACT

A method for producing a quantum device comprising forming a superconductive layer, forming a mask on the superconductive layer, the mask comprising masking patterns and at least two openings alternately in a direction, the at least two openings) being separated from one another by a separation distance, and further each having a width, such as the separation distance and the width are less than a coherence length of a Cooper pair in said superconductive material, and modifying, through the at least two openings, of the exposed portions of the superconductive layer, so as to form at least two barriers of width di separating the superconductive regions.

18 Claims, 5 Drawing Sheets

(56)　　　　　　　References Cited

OTHER PUBLICATIONS

Pillet et al., "Scattering Description of Andreev Molecules", SciPost Physics Core, vol. 2, No. 2, 2020, 14 Pages.
Su et al., "Andreev Molecules in Semiconductor Nanowire Double Quantum Dots", Nature Communications, 2017, vol. 8, No. 1, 6 Pages.
Pillet et al., "Nonlocal Josephson Effect in Andreev Molecules", Nano letters, 2019, vol. 19, No. 10, 19 Pages.
Scherübl et al., "Transport Signatures of an Andreev Molecule in a Quantum Dot-Superconductor-Quantum Dot Setup", Beilstein Journal of Nanotechnology, 2019, vol. 10, No. 1, 16 Pages.
Torgovkin et al., "High Quality Superconducting Titanium Nitride Thin Film Growth Using Infrared Pulsed Laser Deposition", Superconductor Science and Technology, 2018, vol. 31, No. 5, 11 Pages.
Duvauchelle et al., "Silicon Superconducting Quantum Interference Device", Applied Physics Letters, 2015, vol. 107, 5 Pages.
Chiodi et al. "Proximity-Induced Superconductivity in all-Silicon Superconductor/normal-Metal Junctions", Physical Review B, vol. 96, No. 2, 2017, 7 Pages.

\* cited by examiner

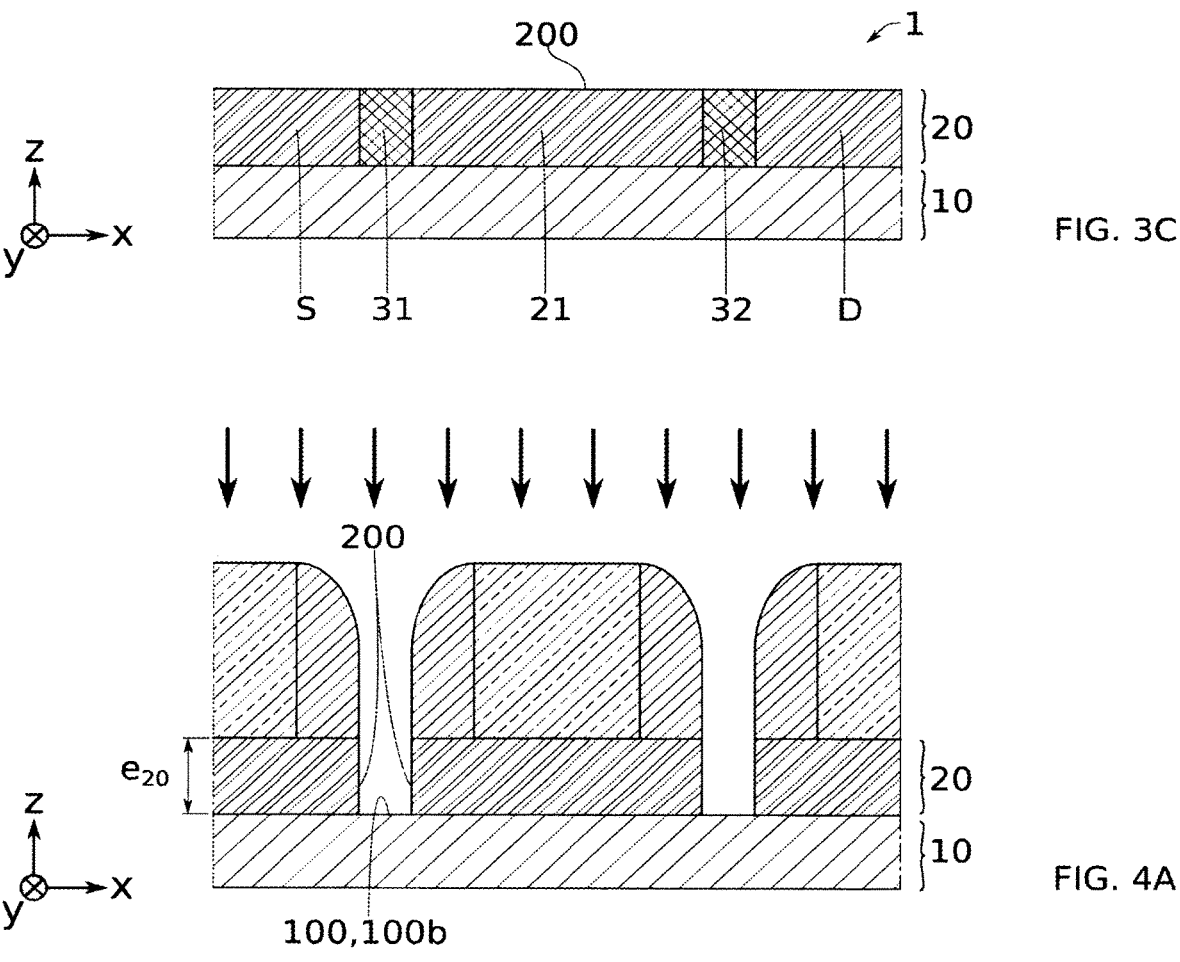
FIG. 3C
FIG. 4A
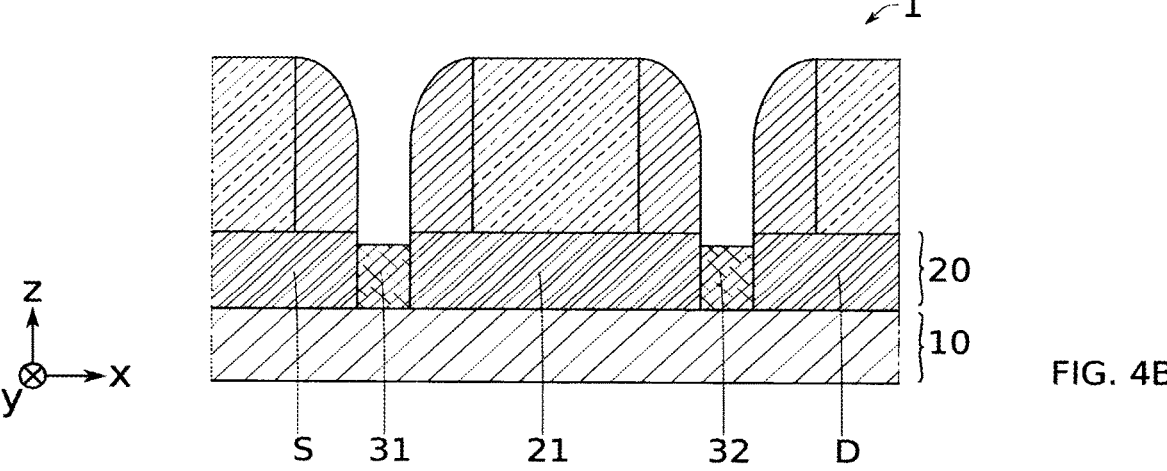
FIG. 4B

METHOD FOR MAKING A QUANTUM DEVICE

TECHNICAL FIELD

The present invention relates to the field of quantum electronics. It has a particularly advantageous application in producing quantum devices with quantum bits (qubits). A particular application relates to producing Andreev molecules or chains comprising a plurality of superconductive regions regularly separated by barriers coupled together.

STATE OF THE ART

In the field of quantum electronics, a quantum bit or qubit corresponds to a quantum state which represents the smallest unit for storing quantum information. This quantum state is characterised by the quantum superposition of several states, in particular state 0 and state 1. In practice, the quantum bit can be obtained by different devices based on different architectures. Thus, there are qubits linked to a quantum state:

of a charge carrier, for example the spin of an electron (spin qubit), of a current circulating between two superconductive regions through a Josephson junction, for example its phase (superconductive qubit), of a trapped ion or of an atom or of a molecule, for example its energy level, of a photon, for example, its polarisation (photonic qubit).

Each type of device has intrinsic advantages and distinct disadvantages. For example, the quantum devices with spin qubits have a low energy consumption in operation and a manufacturing facilitated by microelectronic methods. These quantum devices with spin qubits however have limited entanglement of spin qubits.

Quantum devices with superconductive qubits on the contrary make it possible to obtain a good entanglement between qubits. These devices also however have too great sensitivity to environmental variations.

To overcome these disadvantages, a coupling between several superconductive regions separated by Josephson junctions has been proposed. Such a device with superconductive qubits comprising two Josephson junctions coupled in series forms an Andreev molecule. Such a device with superconductive qubits, comprising more than two Josephson junctions coupled in series, typically forms an Andreev chain.

The document "Andreev molecules in semiconductor nanowire double quantum dots, Z. Su et al., Nature Communications volume 8, 585 (2017)" describes an embodiment of a quantum device with superconductive qubits forming an Andreev molecule. The embodiment method disclosed by this document is however not industrialised. It is difficult to reproduce. The integration density obtained by this method is further very low.

There is therefore a need consisting of providing an industrial method for producing Andreev molecules or chains. An aim of the present invention is to meet this need. In particular, an aim of the present invention is to propose a method for producing a quantum device having an improved reproducibility. Another aim of the present invention is to propose a method for producing a quantum device enabling a high integration density.

Other aims, features and advantages of the present invention will appear upon examining the following description and accompanying drawings. It is understood that other advantages can be incorporated.

SUMMARY

To achieve this aim, a first aspect of the invention relates to a method for producing a quantum device, comprising the following steps:

A formation on a substrate of a superconductive layer made of a superconductive material, said superconductive layer extending mainly along a basal plane xy, A formation of a mask on the superconductive layer, said mask comprising masking patterns and at least two alternating openings in a so-called conduction direction of the plan xy, said at least two openings exposing respectively at least two portions of the superconductive layer and being separated from one another in said conduction direction by a separation distance p, said at least two openings further each having a width d in said conduction direction, such that the separation distance p and the dimension d are less than a coherence length L of a Cooper pair in said superconductive material, A modification, through said at least two openings, of said at least two exposed portions of the superconductive layer, so as to form at least two barriers of width d, each barrier separating two superconductive regions of the superconductive layer.

The superconductive layer is thus structured so as to form the superconductive regions and the alternating barriers, via the masking patterns and the openings of the mask. The method thus makes it possible to produce Andreev molecules or chains, fully localised, and with an excellent dimensional control. Microelectronic methods, for example thin layer deposition for the formation of the superconductive layer, lithography for the formation of the mask, implantations and/or etchings for the formation of the barriers, can be advantageously implemented in this quantum device production method. This makes it possible to obtain an industrial method having an excellent reproducibility. The use of the mask also makes it possible to specifically define the different zones (barriers, superconductive regions) with an accurate dimension control. This makes it possible, in particular, to obtain the necessary conditions for the coupling of barriers together, typically a separation distance p and a dimension d less than a coherence length L of a Cooper pair in the superconductive material.

The use of the mask further makes it possible, for a plurality of quantum devices, to densify the quantum devices. This also makes it possible to dedicate a particular zone for the quantum device(s) on the substrate, in view of a co-integration of other microelectronic devices or components on the same substrate.

An aspect of the invention relates to a method for forming a system comprising a plurality of devices, said method comprising at least one method for producing a quantum device according to the first aspect of the invention, and a production of at least one other device taken from among a transistor-based device, a memory device, another quantum device.

BRIEF DESCRIPTION OF THE FIGURES

The aims, objectives, as well as the features and advantages of the invention will best emerge from the detailed description of embodiments of the latter, which are illustrated by the following accompanying drawings, wherein:

FIGS. 3A to 3C illustrate, as a transverse cross-section, steps of a method for manufacturing a quantum device according to another embodiment of the present invention.

FIGS. 4A to 4B illustrate, as a transverse cross-section, steps of a method for manufacturing a quantum device according to another embodiment of the present invention.

Figure 1:
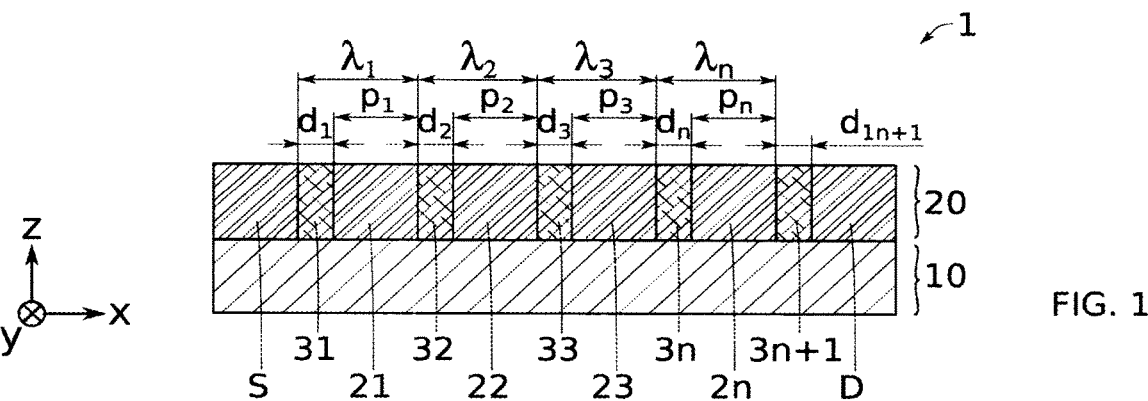
FIG. 1 illustrates a transverse cross-section of an Andreev chain-type quantum device according to an embodiment of the present invention.

The drawings are given as examples and are not limiting of the invention. They constitute principle schematic representations intended to facilitate the understanding of the invention and are not necessarily to the scale of practical applications. In particular, in the principle diagrams, the thicknesses of the different layers and portions, and the dimensions of the patterns are not representative of reality.

DETAILED DESCRIPTION

Before starting a detailed review of embodiments of the invention, below optional features are stated, which can optionally be used in association or alternatively:

According to an example, the method further comprising, after formation of said at least two barriers, an at least partial removal of the mask.

According to an example, the method further comprising, after formation of said at least two barriers, a formation of at least one contact on at least one superconductive region of the superconductive layer. These contacts typically make it possible to polarise (when switched on) the device and make the current circulate in the device. According to an example, at least three contacts are formed on three superconductive regions of the superconductive layer. One or more intermediate contacts can be formed on the superconductive layer along the Andreev chain. According to an example, an electrostatic control gate is formed along the Andreev chain.

According to an example, the formation of the mask comprises the following steps:

A deposition of a dielectric layer on the superconductive layer,

A formation of preparatory patterns alternately with at least two preparatory openings in the dielectric layer, said at least two preparatory openings each having a width in the direction x strictly greater than the width di, A formation, on at least one side of each of the preparatory patterns, of at least one spacer, each masking pattern of the mask comprising a preparatory pattern and at least one spacer.

According to an example, the formation of the mask comprises the following steps:

A deposition of a dielectric layer on the superconductive layer,

A formation of preparatory patterns alternately with at least two preparatory openings in the dielectric layer, said at least two preparatory openings each having a width $di0$ in the direction x strictly greater than the width $di$ in the direction x.

A formation, on at least one side of each of the preparatory patterns, of at least one spacer of width $s6i$ in the direction x, so as to obtain at least two openings of the mask of width $di$, preferably such that $di=di0-2.s6i>3$ nm with 5 nm$\leq s6i \leq$25 nm, each masking pattern of the mask comprising a preparatory pattern and at least one spacer. Thus, $di0$ is the initial width of the preparatory openings, before reduction of size to $di$ by the use of spacers.

According to an example, the respective widths are such that $di0-s6i \leq di \leq di0-2.s6i$. According to an example, the respective widths are such that $di+10$ nm$\leq di0 \leq di+30$ nm.

According to an example, the formation of the mask is configured such that the width $di$ of each of the at least two openings is less than 100 nm, preferably less than or equal to 50 nm, and preferably less than or equal to 20 nm, for example between 3 and 6 nm.

According to an example, the formation of the superconductive layer is configured such that the superconductive layer has a thickness $e20$ in a direction z normal to the basal plane xy, of between 5 nm and 30 nm.

According to an example, the formation of the superconductive layer is done from a silicon layer put in the presence of a BClx gas, by a plurality of laser shots within the silicon layer, so as to incorporate boron to form the superconductive material Si:B++.

According to an example, the plurality of laser shots comprises at least 100 successive laser shots, each having a duration of between 20 ns and 500 ns, and an energy density of between 200 mJ/cm$^2$ and 1.5 J/cm$^2$. According to an example, the formation of the superconductive layer comprises a deposition of a controlled stoichiometry titanium nitride TiN layer.

According to an example, the deposition of the TiN layer comprises a pulsed laser enhanced deposition with an infrared laser of wavelength 1064 nm.

According to an example, the formation of barriers comprises an implantation of species in the exposed portions, so as to obtain a non-superconductive modified material at each of said portions, said modified material having stoichiometry different from that of the non-modified superconductive material of the superconductive regions located on either side of said barrier.

According to an example, the superconductive layer is made of TiN, and the implantation of species comprises an implantation of nitrogen.

According to an example, the formation of barriers comprises an amorphisation of the exposed portions, so as to obtain a non-superconductive modified material at each of said portions, said modified material having an amorphous structure different from a crystalline structure of the non-modified superconductive material of the superconductive regions located on either side of said barrier.

According to an example, the superconductive layer is doped boron silicon-based, and the amorphisation comprises a germanium implantation at a dose of between $10^{15}$ and $10^{20}$ cm$^{-2}$.

According to an example, the formation of the barriers comprises an etching of the superconductive layer at each of said exposed portions, in a direction z normal to the basal plane xy and over a depth $dp20$ greater than at least half of a thickness $e20$ of the superconductive layer, so as to obtain a geometric constriction in height between the superconductive regions located on either side of said barrier.

According to an example, the formation of the barriers further comprises, after said etching of the superconductive layer, an epitaxy of a non-superconductive material between the superconductive regions located on either side of said barrier.

According to an example, the superconductive layer is boron doped silicon-based and the epitaxy comprises a non-doped silicon epitaxy.

According to an example, after formation of the barriers, a silicon nitride SiN-based encapsulation layer is formed on the Andreev chain.

Except if incompatible, it is understood that all of the optional features above can be combined so as to form an embodiment which is not necessarily illustrated or described. Such an embodiment is obviously not excluded of the invention. The features of an aspect of the invention, for example the device, the method or the system, can be adapted mutatis mutandis to another aspect of the invention.

It is specified that, in the scope of the present invention, the terms "on", "surmounts", "covers". "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers made of one same material or of different materials.

By a substrate, a stack, a layer "with the basis of" a material A or "A-based", this is a substrate, a stack, a layer comprising this material A only or this material A and optionally other materials, for example alloy elements and/or doping elements. Thus, a silicon-based substrate means, for example, an Si, doped Si, even SiC or SiGe substrate.

By "selective etching vis-à-vis" or "etching having a selectivity vis-à-vis", this means an etching configured to remove a material A or a layer A vis-à-vis a material B or a layer B, and having an etching speed of the material A greater than the etching speed of the material B. The selectivity is the ratio between the etching speed of the material A and the etching speed of the material B.

Several embodiments of the invention implementing successive manufacturing steps are described below. Unless explicitly mentioned otherwise, the adjective "successive" does not necessarily imply, even if this is generally preferred, that the steps immediately follow one another, intermediate steps being able to separate them.

Moreover, the term "step" means carrying out of a part of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

A preferably orthonormal marker, comprising the axes x, y, z is represented in the accompanying figures. When one single marker is represented in one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under", "underlying", "interleaved" refer to positions taken in the direction z.

The terms "vertical", "vertically" refer to a direction along z. The terms "horizontal", "lateral", "laterally" refer to a direction in the plane xy. Unless explicitly mentioned otherwise, the thickness, the height and the depth are measured along z. In the accompanying drawings, the widths are measured along x.

An element located "in vertical alignment with" or "to the right of" another element means that these two elements are both located on one same line perpendicular to a plane, wherein a lower or upper face of a substrate mainly extends, i.e. on one same line oriented vertically in the figures.

In a superconductive material, the charge carriers are locally paired two-by-two in a Cooper pair. This pairing is effective over a certain distance L defining the size of the Cooper pairs. This distance L is called coherence length below. The material thus acquires a macroscopic quantum phase. If two superconductive regions are brought close together enough, while keeping a thin barrier between the two, it is possible to make the Cooper pairs cross through the barrier, while preserving their quantum 30 coherence. Such a barrier letting the electrons pass between two superconductive regions is called a Josephson junction (JJ). This results in a non-dissipative current, the amplitude of which depends on the phase difference of the two superconductors.

In the scope of the present invention, different types of Josephson junctions or barriers between two superconductive regions are considered. A barrier can be seen as a structural description and a junction can be seen as a functional description of the same entity. "Barriers" and "Josephson junctions" are, in this case, used as synonyms. A barrier extends from a barrier formed of a non-superconductive material or of a material for which the superconductivity is weakened.

The structure of the barriers can be based, non-exhaustively, on non-superconductive, insulating or metal material, or on a geometric singularity or also on a grain boundary. The corresponding junctions can be of the "tunnel", "constriction", or "contact point" type, or also a grain boundary.

The tunnel effect junctions typically have an SIS *superconductor-insulator-superconductor)-type structure; in these junctions, the transport mechanism is mainly dominated by the correlated tunnel effect of the electrons which form a Cooper pair through the insulating barrier. In an SNS (superconductor-normal metal-superconductor) junction, the transport mechanism is mainly dominated by the effect of proximity. Generally, at the interface between a superconductor and a normal metal, the quantum coherence is also maintained in the normal metal under a distance defined by the coherence length.

To determine if an Andreev molecule or an Andreev chain is produced, low-temperature electrical measurements of the Josephson current can be taken. In particular, if the quantum phase relationship of the Josephson current at one of the ends of the chain can be modulated by the amplitude of the Josephson current to the other end, this indicates that a coupling is effective between all the barriers. The quantum device can thus correspond to an Andreev molecule or to an Andreev chain.

FIG. 1 illustrates, as a transverse cross-section, an embodiment of an Andreev chain-type quantum device. This quantum device 1 comprises a plurality of superconductive regions 21, 22, 23, 2$i$ (i=1 . . . n) separated from one another by barriers 31, 32, 33, 3$i$ (i=1 . . . n+1). Current injection regions, for example a source region S and a drain region D are preferably located at each end of the Andreev chain. The source S and the drain D are typically separated from the rest of the Andreev chain by two barriers 31, 3n+1 at each end of the Andreev chain.

Each barrier 3i has a width di (i=1 . . . n+1) along x. Each of the barriers 3i is configured to let the electrons pass in the form of Cooper pairs of a superconductive region 2i to another superconductive region 2i+1. In particular, each of the widths di is chosen less than the coherence length L of the Cooper pairs within the superconductive material of the superconductive regions. According to a possibility, all the widths di are equal to one another. Alternatively, the widths di vary from one end to the other of the Andreev chain, for example according to a monotonous, increasing or decreasing progression between the source and the drain. Other variations in width of the barriers can be considered, with di<L. According to an example, the widths di are preferably less than 100 nm, preferably less than 50 nm, for example between 3 and 6 nm. According to an example, the widths di correspond to the minimum distance separating two superconductive regions.

The superconductive regions 21, 22, 23, 2i (i=1 . . . n) are typically formed within a superconductive layer 20, made of a superconductive material. They are physically separated two-by-two by the barriers 31, 32, 33, 3i (i=1 . . . n+1). They are, however, connected together via Josephson junctions formed by these barriers 31, 32, 33, 3i (i=1 . . . n+1). To obtain an Andreev molecule or an Andreev chain, all the barriers are coupled with one another. This implies that the separation distance pi between two barriers, which corresponds to the width pi of the superconductive region 2i in question, that is less than the coherence length L of the Cooper pairs. According to a possibility, all the widths pi are equal to one another. Alternatively, the widths pi vary from one end to the other of the Andreev chain, for example according to a monotonous, increasing or decreasing progression between the source and the drain. Other variations in width of the superconductive regions can be considered, with pi<L. According to an example, the widths pi are preferably less than 100 nm, and preferably less than 50 nm. According to an example, the separation distances pi correspond to the minimum distance separating two barriers.

The Andreev chain typically has a period λi=di+pi. According to a possibility, this period is constant along the chain. Alternatively, the period can vary continuously or discontinuously, monotonously or non-monotonously, along the chain. According to an example, the period λi is between 40 and 80 nanometres. For example, λi=40 nm, di=20 nm, pi=20 nm.

The superconductive layer 20 is made of a superconductive material. It has a thickness e20 less than or equal to 300 nm, preferably between 5 and 30 nanometres. The superconductive layer 20 is typically carried by a substrate 10.

The substrate 10 can be a so-called silicon Si "bulk" substrate, or a silicon on insulator SOI-type substrate. Other substrates 10, comprising, for example, different metal layers or levels interweaved between an Si bulk part and the superconductive layer 20, can also be considered.

FIGS. 2A to 2D have a first embodiment of an Andreev chain according to the method of the present invention. The first step of this method consists of forming the superconductive layer 20 on the substrate 10.

According to a possibility, the superconductive layer 20 is titanium nitride TIN-based. It can be deposited by physical or chemical vapour deposition techniques directly on the substrate 10. The deposition technique is advantageously chosen so as to enable a good control of the stoichiometry of the TIN superconductive layer. The superconductive TiN deposition can be done by pulsed laser deposition PLD, by using a 1064 nm infrared pulsed laser. Stoichiometric TIN thicknesses of between 5 and 300 nanometres can be advantageously obtained by PLD. The critical temperature of the superconductive TiN is typically between 2.45 and 4.8K. In theory, the superconduction of the TIN can be obtained for a critical temperature of around 5.6K.

According to another possibility, the superconductive layer 20 is silicon-based made superconductive by incorporation of boron. From a silicon-based substrate 10, a method consists of implanting the boron B via an implanter, then of performing a laser annealing at the B implanted silicon layer, so as to oversaturate the silicon with boron Si:B++. Such a method is known under PLIE meaning "Pulsed Laser Induced Epitaxy". The boron-oversaturated superconductive silicon Si:B++ typically comprises a few $1016 \text{ cm}^{-2}$.

Another method consists of immersing the silicon-based substrate 10 in a BClx gas, and of performing a plurality of laser shots to incorporate boron in the silicon. Between 100 and 200 laser shots are typically required to incorporate boron in the silicon so as to make it Si:B++ superconductive. Such a method is known under GILD meaning "gas immersion laser doping". In addition, ample details relating to this GILD method can be found in the reference, "C. Marcenat et al., Phys. Rev. B 81, 020501 (2010)". This method can be implemented on Si bulk or on SOI. The superconductive silicon thicknesses that can be reached by this method are around 20 to 80 nm. Such a method is advantageously very reproducible and can be industrialised.

After having formed the superconductive layer 20 on the substrate 10, a mask comprising masking patterns and openings is formed on the superconductive layer. This mask can be typically forms by photolithography.

Figure 2A:
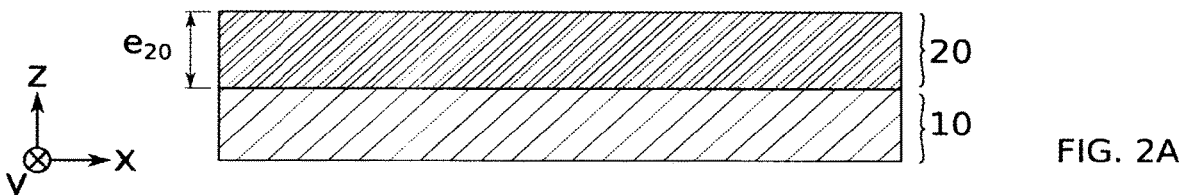
FIGS. 2A to 2D illustrate, as a transverse cross-section, steps of a method for manufacturing a quantum device according to an embodiment of the present invention.
Figure 2B:
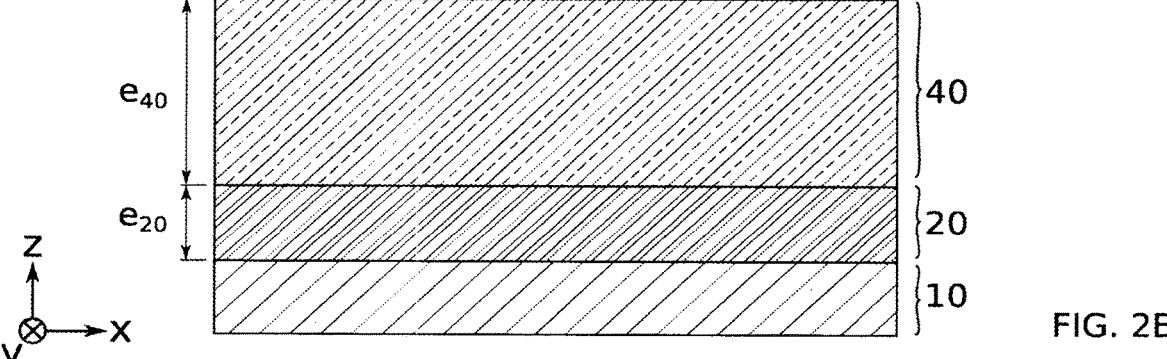

As illustrated in FIG. 2B, a layer 40 made of a dielectric material, for example made of silicon nitride SiN or of silicon oxide $SiO_2$, is deposited on the superconductive layer 20. The layer 40 has a thickness e40 typically between 30 nm and 90 nm. According to a possibility, this layer 40 comprises at least two sublayers, for example an SiN layer on an $SiO_2$ layer, or conversely, an $SiO_2$ layer on an SiN layer. Other types of masking layer 40 can also be considered.

Figure 2C:
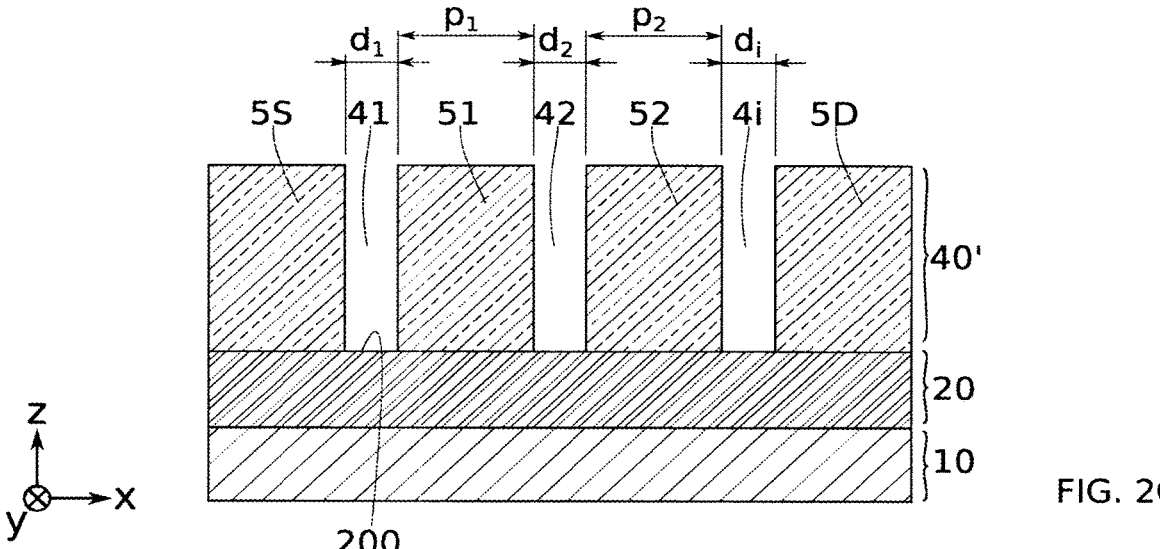

As illustrated in FIG. 2C, openings 41, 42, 4i (i=1 . . . n1) are formed in the layer 40. These openings 4i lead to the surface 200 of the superconductive layer 20. The openings 4i separate masking patterns 5S, 51, 52, 5i (i=1 . . . n), 5D. In this embodiment, the openings 4i are directly in vertical alignment with the future barriers 3i. The openings 4i therefore have the width(s) di (i=1 . . . n+1) along x. The masking patterns 5i are directly in vertical alignment with the future superconductive regions 2i. They therefore have the width(s) pi (i=1 . . . n) along x. The openings 4i and the masking patterns 5i are typically formed by photolithography/etching according to well-known microelectronic methods for these materials and these dimensions. The mask thus formed is referenced 40' in the figures.

Figure 2D:
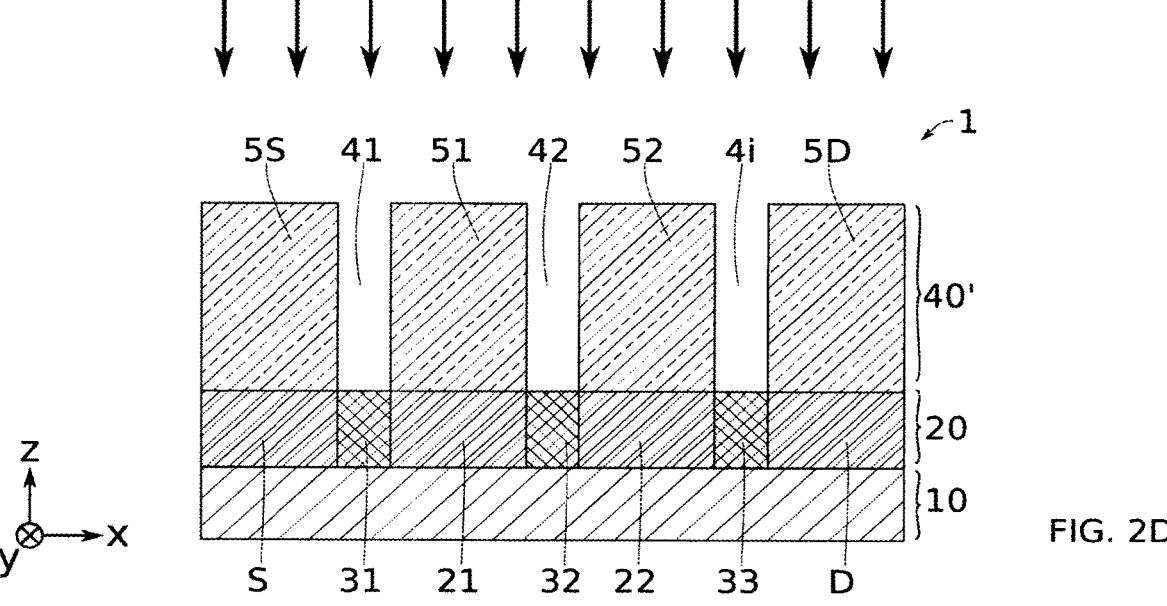

As illustrated in FIG. 2D, a modification of the superconductive material of the superconductive layer 20 is done through the openings 4i. This modification has the aim of making the material non-superconductive in vertical alignment with the openings 4i. This modification therefore makes it possible to create the barriers 3i between the superconductive regions 2i.

According to an example, this modification is done by implantation of species, for example in an implanter or from an inductively coupled plasma (ICP) within an etching reactor. This implantation is preferably directed along z. The implementation is preferably done along the whole thickness e20 of the superconductive layer 20. According to a particular example, for a TiN superconductive layer, a nitrogen N implantation can be proceeded with. This induces a change in stoichiometry in the TIN. The material is subsequently no longer superconductive, localised under the openings 4i. Thus, a so-called SNS (superconductor-normal-superconductor) Josephson junction is obtained between two superconductive regions 2i.

According to another example, the modification is done by amorphisation of the superconductive layer 20 in vertical alignment with the openings 4i. This amorphisation can be done conventionally by implantation of sufficiently heavy ions, such as germanium or gallium within the superconductive layer 20. The amorphisation is done preferably along the whole thickness e20 of the superconductive layer 20. According to a particular example, for an Si-based superconductive layer, this amorphisation can be done by implantation of germanium at a dose of between $10^{15}$ and $10^{20}$ cm$^{-2}$. This makes it possible to break the continuity of crystalline structure between the superconductive regions 2i. There again, an SNS Josephson junction is obtained between two superconductive region 2i. Such a barrier 3i by amorphisation can support a subsequent thermal budget of about 500° C. This is fully compatible with so-called FEOL (Front End Of Line) conventional microelectronic steps. This is also compatible with so-called BEOL (Back End Of Line) conventional microelectronic steps.

Figure 3A:
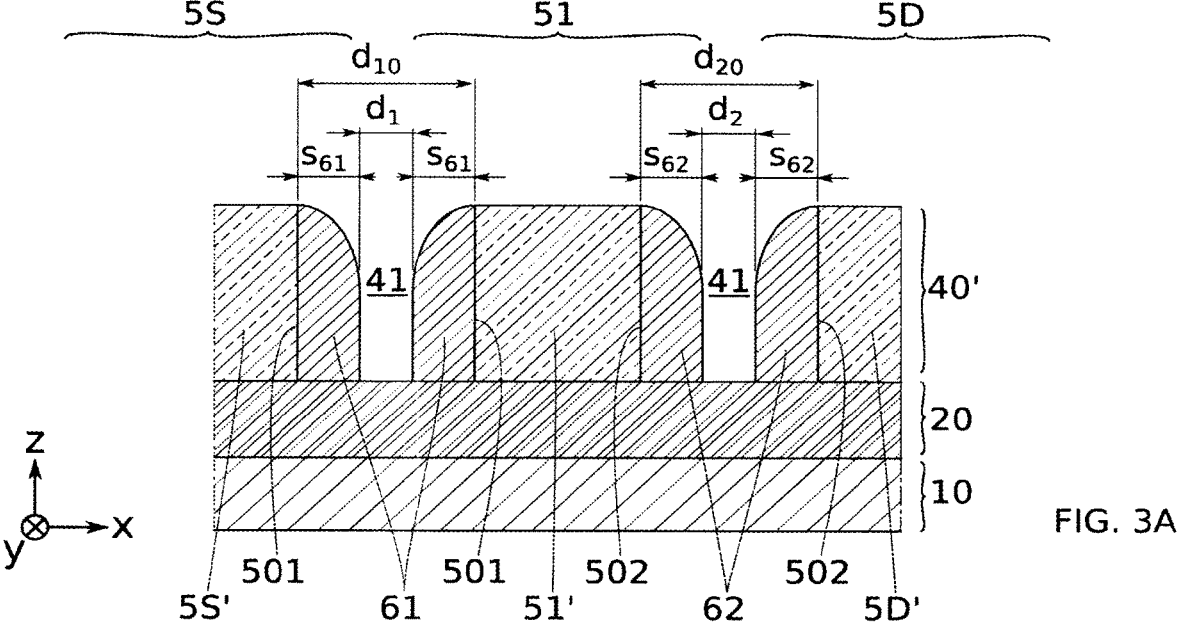
Figure 3B:
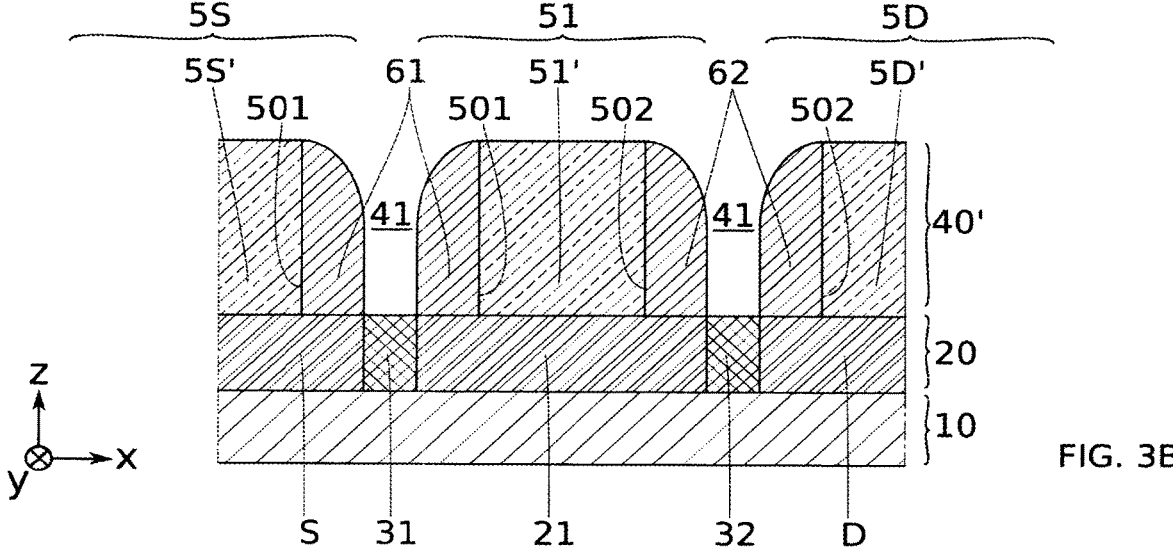

FIGS. 3A to 3C illustrate another embodiment of the method according to the invention. In this embodiment, the masking patterns 5S, 5i, 5D and the openings 4i are formed in two steps. A first step consists of forming preparatory patterns 5S', 5', 5D' separated by preparatory openings of width di0 greater than the width di of the final openings 4i. This first step can be carried out identically to the embodiment described above and illustrated in FIG. 2C. A second step illustrated in FIG. 3A then consists of forming one or more spacers 6i (i=1 . . . n+1) on at least one side 50i (i=1 . . . n+1), and preferably on the two sides 50i transverse to the direction x of each preparatory opening. The formation of the spacers makes it possible to reduce the width of the preparatory opening, so as to obtain the width of the final opening.

If the preparatory opening has a closed contour, one single spacer 6i can border the closed contour of the preparatory opening. In projection along z, the spacer thus forms a ring against the closed contour of the preparatory opening. In a transverse cross-section along a plane xz, the spacer has two parts 6i opposite one another on each of the sides 50i of the preparatory opening. These two parts are generally referenced as being the spacers, even if these can be considered as belonging to one single and same spacer. If the preparatory pattern has a closed contour, one single spacer can border the closed contour of the preparatory pattern. In projection along z, the spacer thus forms a ring around the preparatory pattern. In a transverse cross-section along a plane xz, the spacer has two parts 6i, 6i+1 opposite one another on each of the sides 50i, 50i+1 of the preparatory pattern. These two parts are generally referenced as being the spacers, even if these can be considered as belonging to one single and same spacer.

According to a possibility, only one of the sides 50i is covered by a spacer 6i. According to another possibility, two distinct spacers cover or border each of the sides 50i, without which they form a ring projecting along z. Different configurations of spacers can be considered within the preparatory openings. After formation of the spacer(s), the masking pattern typically comprises the preparatory pattern and the spacer(s).

This or these spacer(s) 6i has/have a width s6i along x, on the side in question. This or these spacer(s) 6i advantageously make(s) it possible to reduce the width di0 so as to obtain the width di for the corresponding opening 4i, with a good dimensional control. The dimensional control on the width di of the opening 4i is improved. Thus, expanded masking patterns 5S, 5i, 5D and openings 4i are obtained, the width di of which is reduced. The width s6i of the spacers can be between 5 nm and 20 nm, preferably between 5 nm and 10 nm.

As illustrated in FIG. 3B, after formation of the spacers 61, 62, 6i, the modification of the exposed portions of the superconductive layer 20 can be done, as above, by implantation and/or by amorphisation.

As illustrated in FIG. 3C, after creation of the barriers, the masking patterns can be removed, so as to expose the surface 200 of the superconductive layer 20. The source S and the drain D and/or the superconductive regions 2i are thus accessible, for example for the formation of electrodes or electrical contacts. According to a non-illustrated possibility, electrical contacts are formed on the source and drain. According to another possibility, an electrode is formed on at least some superconductive regions 2i.

FIGS. 4A to 4B illustrate another embodiment of the method according to the invention. In this embodiment, the formation of barriers is done in two steps. A first step consists of etching the superconductive layer 20 on at least one part of the height of the exposed portions. According to an example, the layer 20 is etched partially along z, over a depth dp20 less than a thickness e20 of the superconductive layer, so as to form a constriction along z in the superconductive layer 20. This type of Josephson junction is called SCS constriction junction (superconductor-constriction-superconductor).

In the example illustrated in FIG. 4A, the exposed portions of the superconductive layer 20 are etched along z over the whole of their height e20, so as to expose the parts 100b of the surface 100 of the substrate 10. Surfaces or facets 200b of the superconductive layer 20 are also created and exposed.

As illustrated in FIG. 4B, the barriers 31, 32, 3i can then be formed by epitaxy from the exposed facet(s) 100b, 200b. According to an example, they can be formed by deposition or epitaxy of a non-superconductive material. According to an example, the substrate 10 is Si-based and the superconductive layer 20 is Si:B++-based, and an intrinsic or slightly doped silicon epitaxy is performed. The barriers 31, 32, 3i are thus non-superconductive silicon-based. According to another example, the facet(s) 100b of the substrate are SiO$_2$-based, and the non-superconductive silicon epitaxy is done laterally, from the single facets 200b. Grain boundaries can appear during epitaxy, in particular during the joining of different growth fronts. The barriers 31, 32, 3i do not necessarily have the same height as the superconductive layer. An SNS and/or SCS Josephson junction or a grain boundary can thus be formed.

Except if incompatible, the different steps of the embodiments described above can be combined, so as to produce a quantum device 1. In particular, the use of spacers, the removal of the mask are optional steps which could be done for all the embodiments. Certain modifications of the superconductive layer can optionally be combined at one same superconductive layer portion, for example an amorphisation followed by an etching, or at different superconductive layer portions. This can make it possible to form SNS/SCS hybrid junctions or SNS/SCS hybrid chains.

Figure 5A:
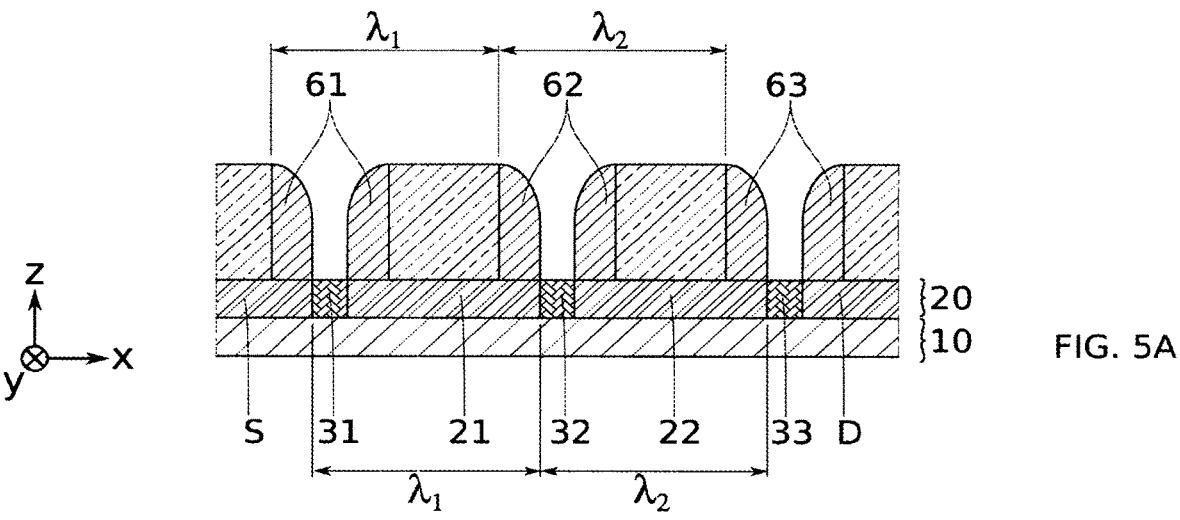
FIG. 5A illustrates, as a transverse cross-section, a quantum device according to an embodiment of the present invention.
Figure 5B:
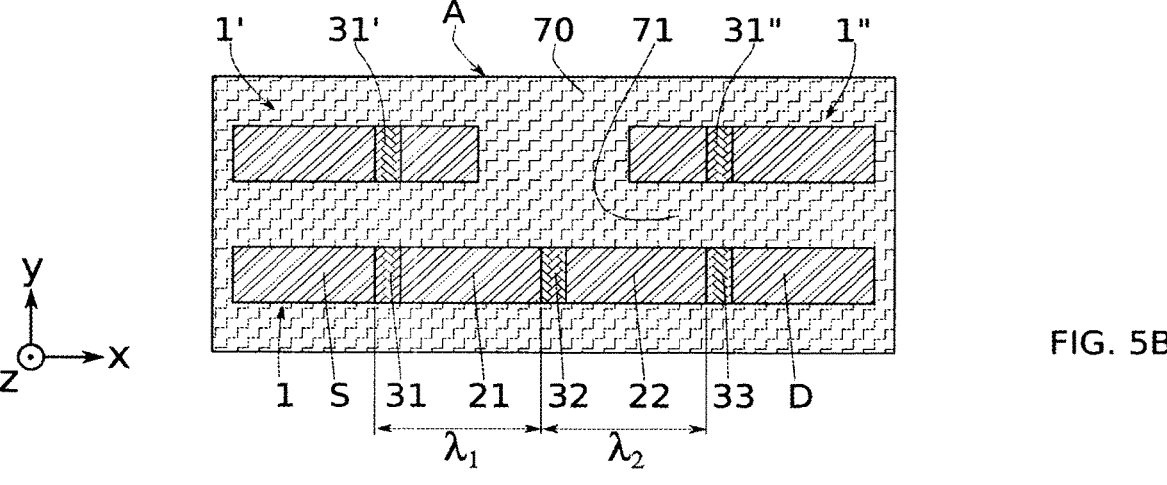
FIG. 5B illustrates, as a top view, the quantum device partially illustrated in FIG. 5A, co-integrated with other quantum devices, according to an embodiment of the present invention.

As illustrated in FIGS. 5A, 5B, simple Josephson junctions, Andreev molecules or chains can be produced by this method, industrially. The top view illustrated in FIG. 5B groups together different quantum devices 1, 1', 1" comprising Josephson junctions 31, 32, 33, 31', 31" formed according to one of the embodiments of the method according to the invention. These devices 1, 1', 1" are disposed on one same zone A of a substrate, and insulated from one another, for example by a case 70 and/or insulation trenches 71 made of a dielectric material, such as $SiO_2$. Advantageously, such a zone comprising a plurality of quantum devices can have small dimensions, for example of around a few tens of nanometres to a few hundred nanometres along y, and around a few hundred nanometres to a few micrometres along x. This makes it possible to obtain a high integration density. Complex Andreev systems or chains can thus be produced. The method according to the invention is further fully compatible with other steps of the method of microelectronic technologies.

Figure 6:
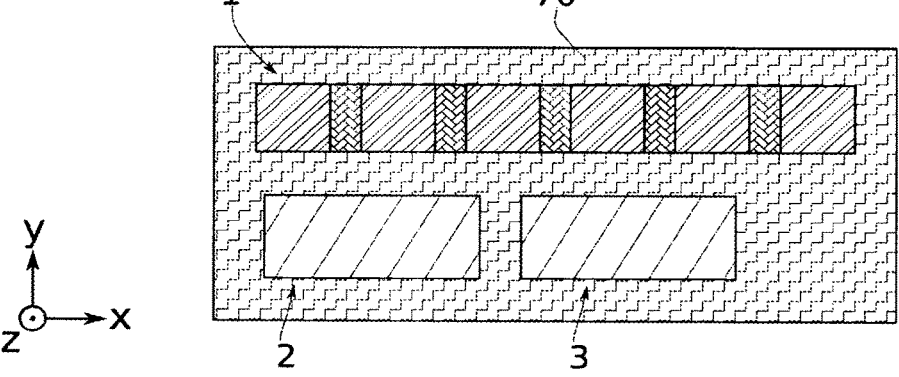
FIG. 6 illustrates, as a top view, a quantum device co-integrated with other non-quantum devices, according to an embodiment of the present invention.

According to a possibility illustrated in FIG. 6, the quantum device 1 can be advantageously co-integrated with other devices 2, 3, for example devices 2 based on a CMOS (Complementary Metal Oxide Semiconductor) transistor architecture and/or RAM (Random Access Memory) memory type devices 3.

Other applications can be considered. The invention is not limited to the embodiments described above.

The invention claimed is:

1. A method for producing a quantum device, the method comprising:

forming, on a substrate, a superconductive layer made of a superconductive material, said superconductive layer having a face extending mainly along a basal plane, forming a mask on the superconductive layer, said mask comprising masking patterns and at least two openings separated by a masking pattern and disposed alternately in a direction of the plane, said at least two openings exposing respectively at least two portions of the superconductive layer and being separated from one another in said direction by a separation distance, said at least two openings further each having a width di (i=1 . . . n+1) in said direction, the separation distance and the width di being less than a coherence length of a Cooper pair in said superconductive material, and modifying, through said at least two openings, the superconductive material within the at least two exposed portions of the superconductive layer, so as to transform the superconductive material within the at least two exposed portions into non-superconductive material, and form at least two barriers of the width di, each barrier separating two superconductive regions of the superconductive layer.

2. The method according to claim 1, wherein the at least two barriers form Josephson-type junctions.

3. The method according to claim 1, further comprising, after formation of said at least two barriers, at least partially removing the mask and forming at least one contact on at least one superconductive region of the superconductive layer.

4. The method according to claim 1, wherein the forming the mask further comprises:

depositing a dielectric layer on the superconductive layer, forming preparatory patterns alternately with at least two preparatory openings in the dielectric layer, said at least two preparatory openings each having a width di0 in the direction strictly greater than the width di in the direction, and forming, on at least one side of each of the preparatory patterns, at least one spacer of width s6i (i=1 . . . n+1) in the direction, so as to obtain the at least two openings of the mask of the width di (i=1 . . . n), preferably such that di=di0−2·s6i>3 nm with 5 nm≤s6i≤25 nm, each masking pattern of the mask comprising a preparatory pattern and at least one spacer.

5. The method according to claim 1, wherein the forming the superconductive layer is done from a silicon layer put in a presence of a BClx gas, by a plurality of laser shots within the silicon layer, so as to incorporate boron to form a superconductive material Si:B++.

6. The method according to claim 5, wherein the plurality of laser shots comprises at least 100 successive laser shots, each having a duration of between 20 ns and 500 ns, and an energy of between 200 $mJ/cm^2$ and 1.5 $J/cm^2$.

7. The method according to claim 1, further comprising, after the forming of the superconductive layer and before the forming of the at least two barriers, structuring the superconductive layer by lithography and etching.

8. The method according to claim 1, further comprising, after the forming of the superconductive layer and after the forming of the at least two barriers, structuring the superconductive layer by lithography and etching.

9. The method according to claim 1, wherein the forming of the superconductive layer further comprises depositing a controlled stoichiometry titanium nitride TiN layer.

10. The method according to claim 9, wherein the depositing of the TiN layer comprises a pulsed laser enhanced deposition with an infrared laser of wavelength 1064 nm.

11. The method according to claim 1, wherein the forming of each barrier of the barriers comprises implanting species in the exposed portions, so as to obtain the non-superconductive modified material at each of said portions, said modified material having a stoichiometry different from that of the non-modified superconductive material of the superconductive regions located on either side of said barrier.

12. The method according to claim 11, wherein the superconductive layer is made of TiN and the implanting of the species further comprises implanting nitrogen.

13. The method according to claim 1, wherein the forming of each barrier of the barriers further comprises an amorphisation of the exposed portions, so as to obtain the non-superconductive modified material at each of said portions, said modified material having an amorphous structure different from a crystalline structure of the non-modified superconductive material of the superconductive regions located on either side of said barrier.

14. The method according to claim 13, wherein the superconductive layer is boron doped silicon-based and the amorphisation comprises implanting germanium at a dose of between $10^{15}$ and $10^{20}$ $cm^{-2}$.

15. The method according to claim 1, wherein the forming of the barriers further comprises an etching of the superconductive layer at each of said exposed portions, in a direction normal to the basal plane and over a depth greater than at least half of a thickness of the superconductive layer, so as to obtain a geometric constriction in height between the superconductive regions located on either side of said barrier.

16. The method according to claim 15, wherein the forming of each barrier of the barriers further comprises, after said etching of the superconductive layer, an epitaxy of the non-superconductive material between the superconductive regions located on either side of said barrier.

17. The method according to claim 16, wherein the superconductive layer is boron doped silicon-based and the epitaxy comprises a non-doped silicon epitaxy.

18. The method for forming a system comprising a plurality of devices, the method comprising the method for producing the quantum device according to claim 1, and producing at least one other device taken from among a transistor-based device, a memory device, and another quantum device.

\* \* \* \* \*